United States Patent
Schluter et al.

(10) Patent No.: US 7,188,570 B2
(45) Date of Patent: Mar. 13, 2007

(54) ELECTRICAL EQUIPMENT ENCLOSURE

(75) Inventors: Robert Schluter, Tavernier, FL (US); Richard King, Boontown Township, NJ (US); Nico Corbo, Blakeslee, PA (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 89 days.

(21) Appl. No.: 11/075,053

(22) Filed: Mar. 8, 2005

(65) Prior Publication Data

US 2006/0201404 A1    Sep. 14, 2006

(51) Int. Cl.
  *E05G 1/04* (2006.01)
  *E05G 1/00* (2006.01)

(52) U.S. Cl. .................... 109/59 R; 109/23; 109/29; 109/53; 312/200; 312/218; 312/296

(58) Field of Classification Search .............. 109/59 R, 109/53, 56, 58, 63.5, 64; 312/223.1, 287, 312/265.4, 223.3; 174/480, 50, DIG. 35; 70/78–80, 84, 212, 215, 221; 292/97, 196, 292/340, DIG. 71
See application file for complete search history.

(56) References Cited

U.S. PATENT DOCUMENTS

| | | | | |
|---|---|---|---|---|
| 2,530,543 A | * | 11/1950 | Schneeman | 232/43.4 |
| 2,852,926 A | * | 9/1958 | Chervenka | 70/79 |
| 2,924,477 A | * | 2/1960 | Forshey | 292/216 |
| 3,070,046 A | * | 12/1962 | Paulos | 109/29 |
| 3,086,830 A | * | 4/1963 | Malia | 312/200 |
| 3,175,873 A | * | 3/1965 | Blomquist et al. | 312/296 |
| 4,303,286 A | * | 12/1981 | McClellan | 312/409 |
| 5,791,174 A | * | 8/1998 | Fitzgerald et al. | 70/212 |
| 6,425,648 B1 | * | 7/2002 | Notohardjono et al. | 312/265.4 |
| 2002/0153814 A1 | * | 10/2002 | Robideau | 312/265.4 |

OTHER PUBLICATIONS

Lowell Manufacturing Co.—Lowell 19" W Sectional Cabinets w/Adjustable Rails—Series L250, L253—2 pgs., undated.
Raxxess—Product Catalog—Welded Steel Hinged Wall Rack—Model: SWR—4 pgs.; www.raxxess.com; at least as early as Mar. 1, 2005.
Chatsworth Products, Inc. Catalog—Section 2_46: Cube-it Plus™ Cabinet System—1 pg.; www.chatsworth.com; at least as early as Mar. 1, 2005.
Chatsworth Products, Inc. Catalog—Section 2_50: SilverFrame Wall-Mount Cabinet—3 pgs.; www.chatsworth.com; at least as early as Jan. 11, 2005.

(Continued)

*Primary Examiner*—Brian E. Glessner
*Assistant Examiner*—Alyson M. Merlino
(74) *Attorney, Agent, or Firm*—Drinker Biddle & Reath LLP (57) ABSTRACT

An embodiment of an enclosure for electrical equipment is described. The enclosure has a back part arranged to be mounted to a fixed support and having an open front, and a front part having an open back, arranged to contain electrical equipment, and hinged to the back part. A latch is mounted within one of the back and front parts, and is arranged to latch the front part and the back part closed. A key-operated control on the front of said front part permits a user to release the latch only by use of a key.

17 Claims, 5 Drawing Sheets

OTHER PUBLICATIONS

Atlas Sound—Sectional Wall Cabinets with 12", 15" and 18" Deep Center Section—300B, 320B & 340B Series—4 pgs.—2001.

Lowell Manufacturing Co.—L250 Series Sectional Wall Cabinet w/14" D Mounting Section—4 pgs.—Sep. 25, 2002.

Lowell Manufacturing Co.—L253 Series Sectional Wall Cabinet w/18" D Mounting Section—4 pgs.—Oct. 2, 2002.

Lowell Manufacturing Co.—L2150 Series Surface Front Doors for Lowell Racks and Cabinets—2 pgs.—Apr. 23, 2003.

Middle Atlantic Products, Inc.—DWR Series 19" Wall Mount Rack—2 pgs.—Apr. 6, 2004.

Middle Atlantic Products, Inc.—SR Series Pivoting Rack—2 pgs.; Feb. 14, 2003.

Middle Atlantic Products, Inc.—Security Doors; 2 pgs.; www.middleatlantic.com/rackac/security/security.htm; at least as early as Jan. 11, 2005.

Atlas Sound—Sectional Wall Cabinets w/12", 15" and 18" Deep Center Section—4 pgs.—2001.

* cited by examiner

ELECTRICAL EQUIPMENT ENCLOSURE

FIELD OF THE INVENTION

The present invention relates to an enclosure for electrical equipment and, more particularly, to an enclosure having a back pan, a main section, and optionally a door.

BACKGROUND

Electrical equipment is commonly installed in enclosures, both to protect the equipment from accidental/intentional damage, inhibit interference by unqualified and/or unauthorized personnel, and to protect nearby persons from live electrical components of the equipment.

One form of electrical equipment enclosure comprises a back pan that, in use, is fixed to a wall or other support surface, and a main section that is hinged to the back pan and within which electrical equipment is mounted. The front and rear of the main section are typically open. A door may also be provided, hinged to the front of the main section. Parts of the electrical equipment to which access is required in operation of the equipment may be exposed at the front of the main section. The door may include a lock that is actuated by a key. Parts of the electrical equipment to which more restricted access is limited may be exposed only at the back of the main section. For example, controls may be at the front, and wiring may be at the back. Thus, in this configuration, removal of the equipment may be possible only by accessing the back of the main section.

Access to the rear of the main section of existing electrical cabinets is conventionally prevented through the use of screw rods or by a key-operated lock which secure the main section to the back pan. For example, one cabinet enclosure sold by Raxxess, includes a threaded rod that the extends from the front of the main section through to the back pan where it is threaded into a mating hole in the back pan. The opposite end of the rod is accessible from the front of the main section. The rod is removed by unscrewing the rod. Such locking rods are relatively easy to disable and, thus, provide only minimum security. Also, if the rod requires an uncommon driver bit for removal, the authorized person must remember to carry the special driver bit whenever access to the cabinet might be necessary.

Another common cabinet enclosure on the market uses a key-operated lock system. One lock is located on the side of the cabinet between the main section and the back pan, and locks the two together. A second lock may be included on the front door which locks the door to the main section. One such cabinet is sold by the Lowell Manufacturing Company, as the L250 cabinet. These key-operated locks have been found to be inconvenient since several inches (i.e., about 10–20 cm) of clearance must be provided alongside the cabinet on the side where the lock is mounted (typically the side opposite from the hinges) to allow a user to reach the lock and insert and turn the key.

A need, therefore, exists for an improved locking mechanism for use with such electrical enclosures which permits unlocking of the main section of the enclosure from the back pan which significant clearance required on the side of the cabinet.

SUMMARY OF THE INVENTION

One embodiment of the present invention provides an enclosure for electrical equipment, comprising a back part arranged to be mounted to a fixed support and having an open front, a front part having an open back, arranged to contain electrical equipment, and hinged to the back part, a latch mounted within one of the back part and the front part, and arranged to latch the front part and the back part closed, and a key-operated control on the front of the front part arranged to permit a user to release the latch only by use of a key.

Another embodiment of the invention provides an enclosure for electrical equipment, comprising a back pan having a back adapted to be mounted against a structure, a top, a bottom, two sides, and an open front, a main section arranged to contain rack-mounted electrical equipment, and having an open back, a top, a bottom, two sides, and a front, the main section hinged to the back pan about a hinge axis near to one of the top, bottom, and two sides for closing to a closed position with the open back of the main section facing the open front of the back pan and closed by the back pan and opening to an open position with the open back of the main section accessible, the main section arranged to contain electrical equipment so mounted that the equipment is removable only after opening the main section, a latch mounted inside the main section and arranged to engage the back pan when the main section is closed, and to prevent opening of the main section; a linkage within the main section, operable from the front of the main section to release the latch and permit opening of the main section; and a lock operable from the front of the main section and arranged to enable operation of the linkage to release the latch only when the lock is unlocked.

BRIEF DESCRIPTION OF THE DRAWINGS

For the purpose of illustrating the invention, there are shown in the drawings one or more forms of the invention that are presently preferred; it being understood, however, that this invention is not limited to the precise arrangements and instrumentalities shown. In the drawings.

DETAILED DESCRIPTION OF THE DRAWINGS

Figure 1:
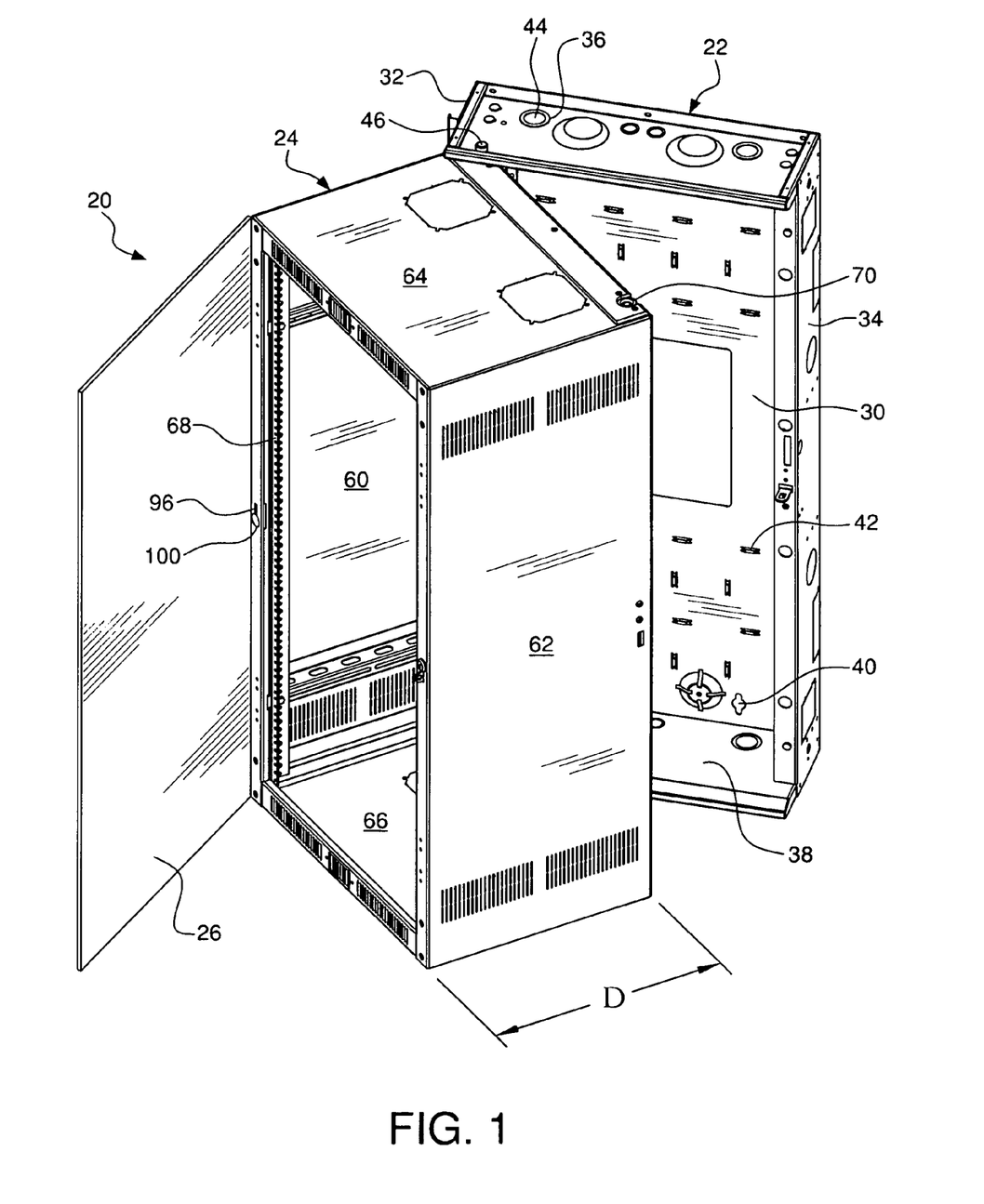
FIG. 1 is a perspective view of one embodiment of an electrical enclosure in accordance with the present invention.

Referring now to the drawings, wherein like reference numerals indicate similar elements throughout the views, and initially especially to FIG. 1, a presently preferred embodiment of an equipment enclosure, indicated generally by the reference numeral 20, includes a back pan 22, a center or main section 24, and a door 26 (shown in phantom).

The back pan 22 has a back wall 30, side walls 32, 34, a top wall 36, and a bottom wall 38. The back wall 30 is provided with fitments 40 for fastening the back pan 22 to a building wall, a mounting rack, or other structure, and preferably with fitments 42 for attaching cable harnesses and other components to the back pan. The walls are preferably provided with breakouts 44 through which cables can be led into the enclosure 20.

The top and bottom walls 36 and 38 project forward (away from the back wall 30) beyond the side walls 32 and 34, and have mountings for hinges 46 at one side, near to the side wall 32. The hinges described in commonly-owned U.S. patent application Ser. No. 10/924,288 by Robert Schluter, which is incorporated herein by reference in its entirety, may be suitable. The other side wall 34 has at its front edge a flange 48 that is turned in towards the middle of the back pan 22. The flange 48 has a striker 50, best seen in FIG. 2, projecting outward from the back pan 22. The striker 50 preferably comprises a flat, horizontal metal tongue with an opening 52 and a rounded tip 54. The striker 50 passes through a slot 56 in the flange 48, and is fastened to the rear or inside surface of the flange 48. Of course, if the striker 50 is formed integral with the flange 48 or mounted on the outside surface of the flange 48, no slot is needed.

It may be desirable to provide the choice of having the hinges 46 at the user's left, as shown in FIG. 1, or at the user's right. In order to avoid having to manufacture and stock both left-hinged and right-hinged versions of the back pan 22 and main section 24, these may be made reversible so that they can be used with the hinges on either side. The enclosure 20 may be assembled left-hinged or right-hinged by the manufacturer or distributor. It should be readily apparent that the present invention is not limited to a enclosure with only left or right pivots. On the contrary, the location of the pivot can be varied depending on the desired enclosure construction.

In the embodiment shown in the drawings, the striker 50 is at the vertical midpoint of the side wall 34, so that the back pan 22 can be effectively reversed by turning it upside down. In an alternative embodiment, where the back pan 22 is asymmetrical top to bottom, the back pan is provided with mountings for the hinges 46 and a slot 56 for the striker 50 at both sides. The back pan is then reversed by moving the hinges 46 and the striker 50 to the opposite sides from those shown in FIG. 1.

Figure 2:
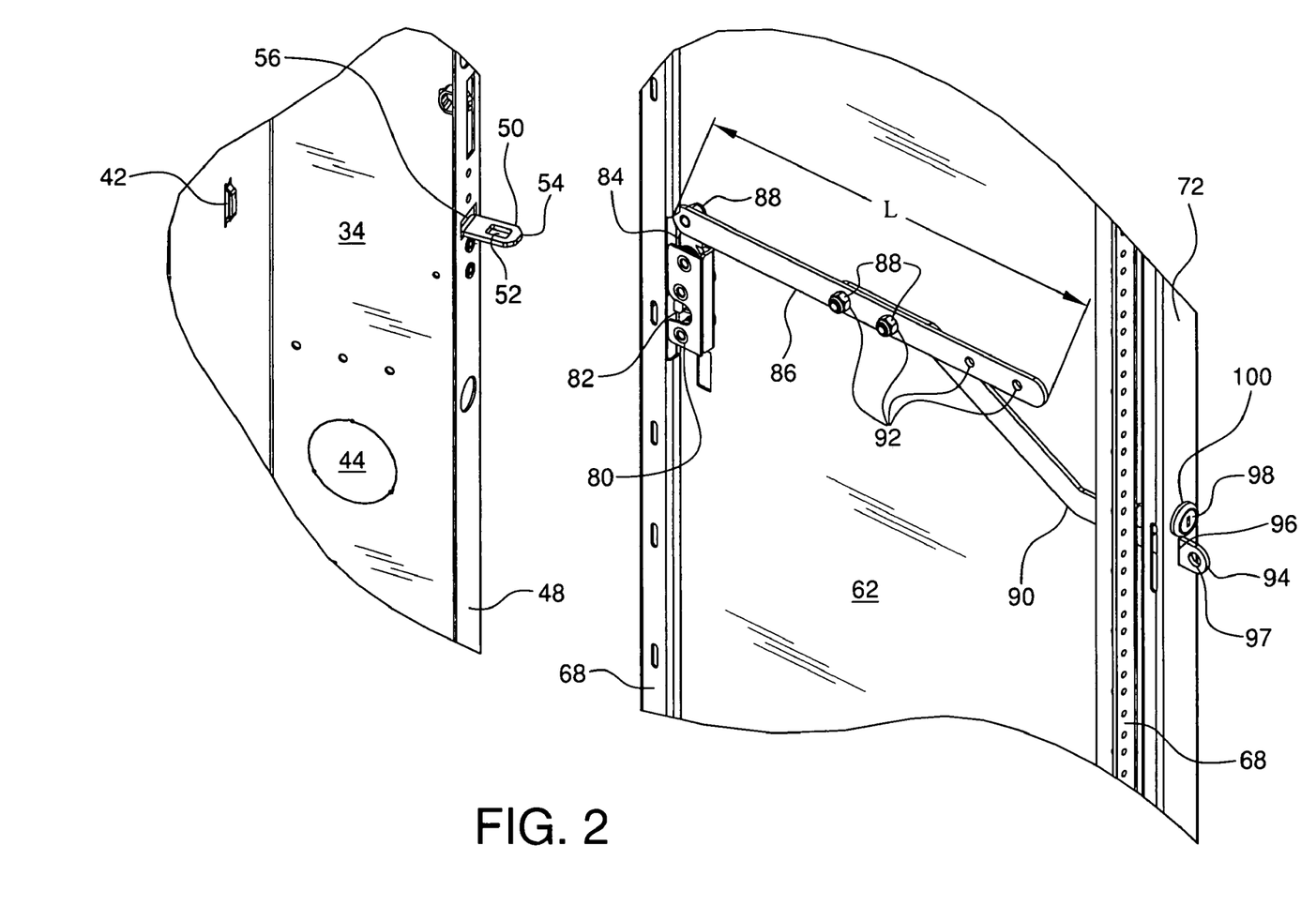
FIG. 2 is a perspective view of a locking mechanism of the electrical enclosure shown in FIG. 1.
Figure 3:
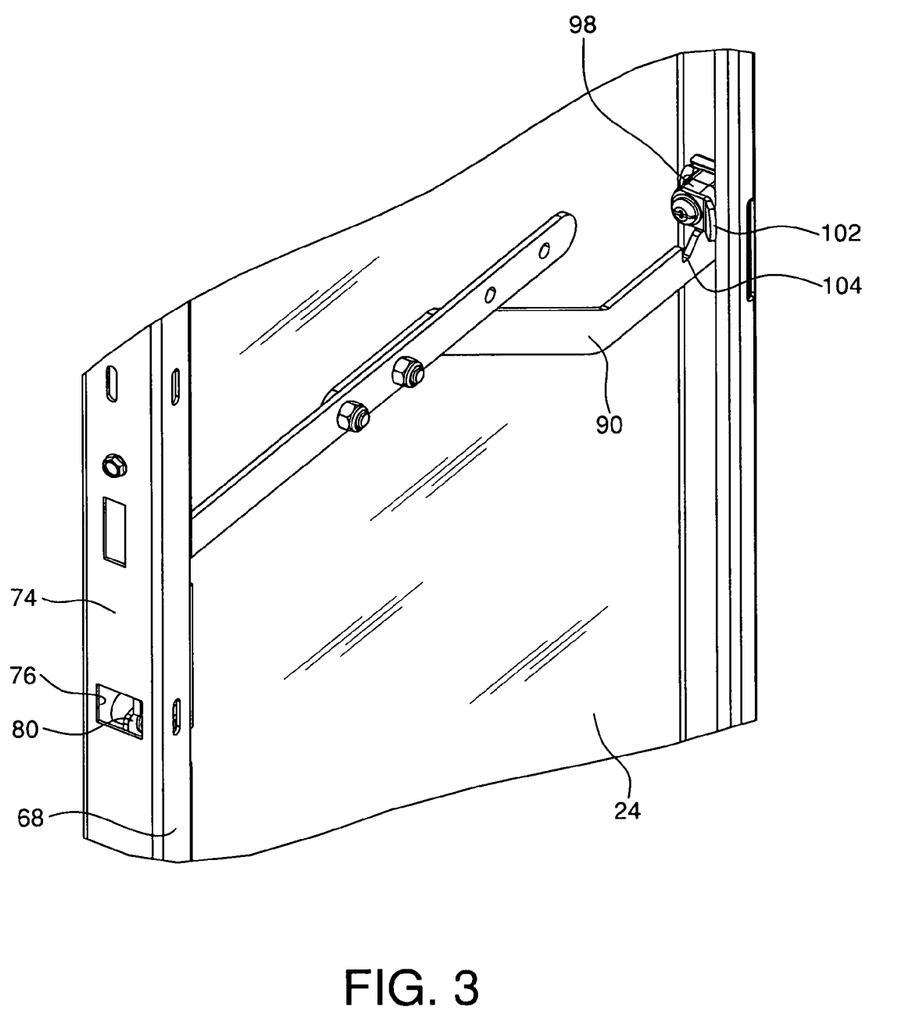
FIG. 3 is a perspective view of part of the locking mechanism shown in FIG. 2.

Referring now also to FIG. 3, the main section 24 of the enclosure 20 has two side walls 60 and 62, a top wall 64, and a bottom wall 66. The inside of the main section 24 is provided with framing, racks or rails 68 to which electrical equipment may be mounted. As shown in FIG. 2, the framing, racks, or rails 68 at the front of the main section 24 are preferably formed by angle sections or with flanges that extend inwardly at the front so that when standard-sized modular components are mounted on racks or rails attached to the framing, the components cannot be removed through the front of the framing. Various other mechanisms can be used to inhibit removal from the front of the main section without accessing the rear of the main section and, thus, the illustrated embodiment should only be considered exemplary.

In the illustrated embodiment, the top and bottom walls 64 and 66 of the main section 24 fit between the top and bottom walls 36, 38 of the back pan 22, and are provided with mountings 70 for the hinges 46. In the embodiment shown, the hinge mountings 70 are provided on both sides of the main section 24, allowing the pivoting or swinging of the main section to be reversed by switching the hinges 46 from one set of mountings to the other.

The side walls 60 and 62 of the main section 24 have inwardly extending front flanges 72 and rear flanges 74 (see FIG. 3). The rear flange 74 of the side wall 62 on the side away from the hinges 46 closes face to face with the flange 48 on the back pan 22, and has an opening 76 for receiving the striker 50 when the main section is positioned against the back pan 22. In the embodiment shown in the drawings, there is a corresponding opening 76 in the rear flange 74 of the other side wall 60, to allow for reversing of the main section as discussed earlier. The opening 76 is preferably formed larger than the striker 50, to provide for manufacturing tolerance or in the case of non-alignment should the main section 24 sag slightly under the weight of the equipment mounted in it, or if the enclosure 20 is twisted out of true because the back pan 22 is mounted onto a wall that is not flat.

On the inside (forward facing) side of the flange 74 is mounted a latch 80. The latch 80 has a locking member 82 that fits through the opening 52 in the striker 50. The opening 52 is preferably larger than the locking member 82, to provide some tolerance. As will be discussed in more detail below, the locking member 82 is actuatable in the vertical direction a sufficient distance to engage and disengage with the opening 52 in the striker 50. In the embodiment shown in the drawings, the latch 80 is of a sort that engages automatically when the striker 50 enters the opening 76, and is released by operating a release lever 84. In the embodiment, the release lever 84 projects upward from the latch 80, and is operated by moving it forward (i.e., away from the flange 74.)

Figure 4:
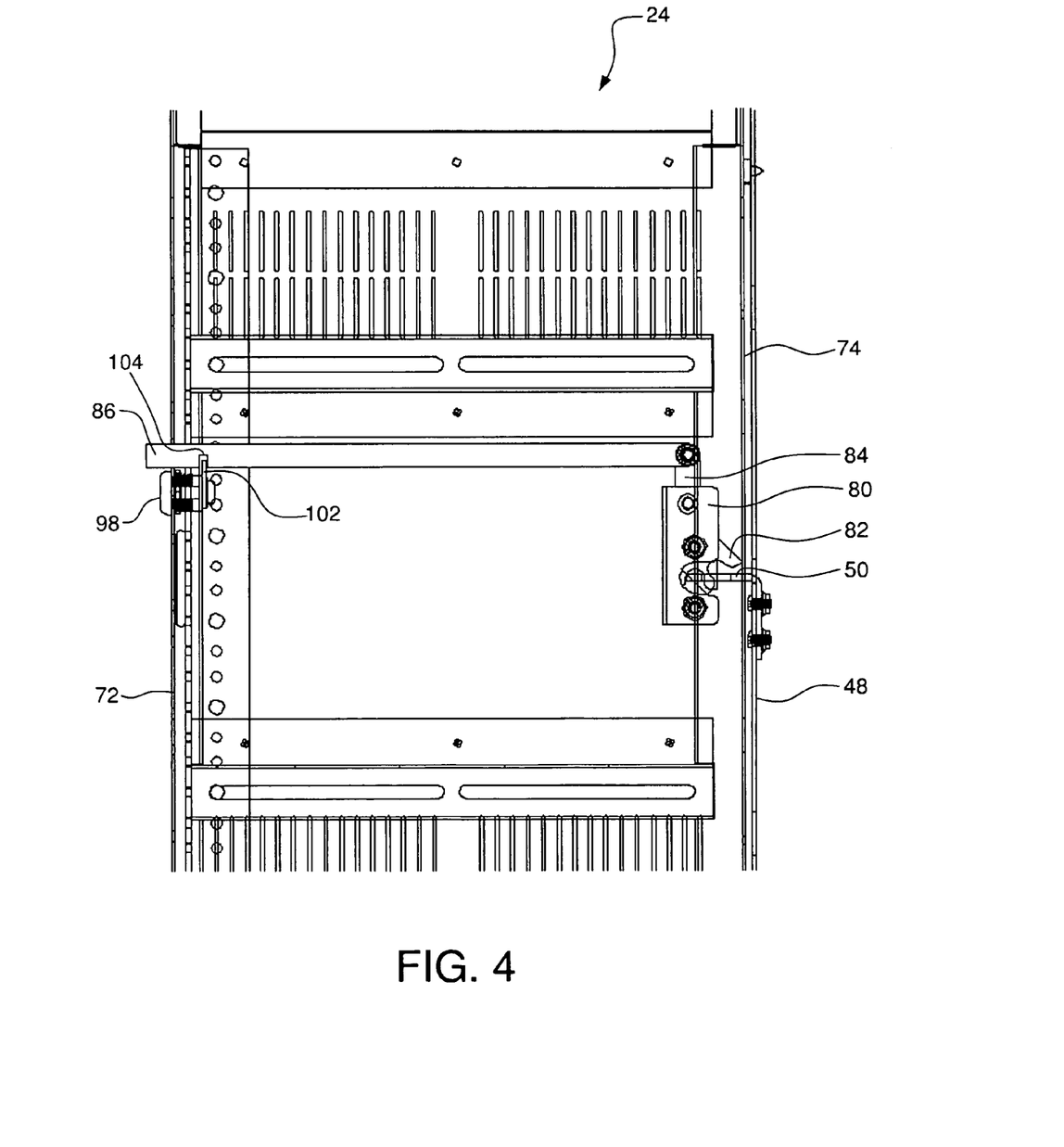
FIG. 4 is a side view of the inside wall of a main section of an enclosure illustrating an alternate embodiment of the present invention.
Figure 5A:
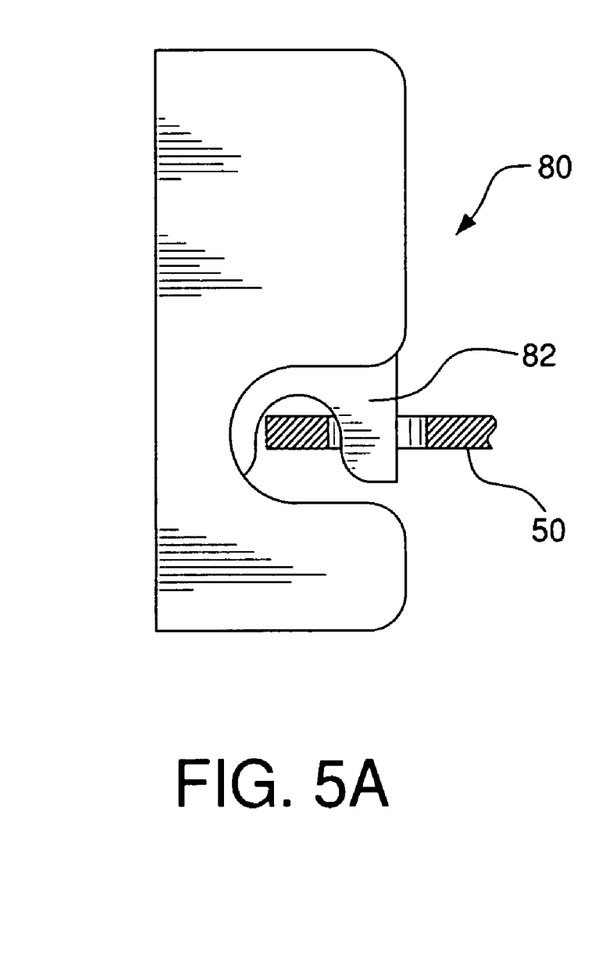
FIGS. 5A and 5B illustrate one embodiment of a latch in its locked and unlocked states.
Figure 5B:
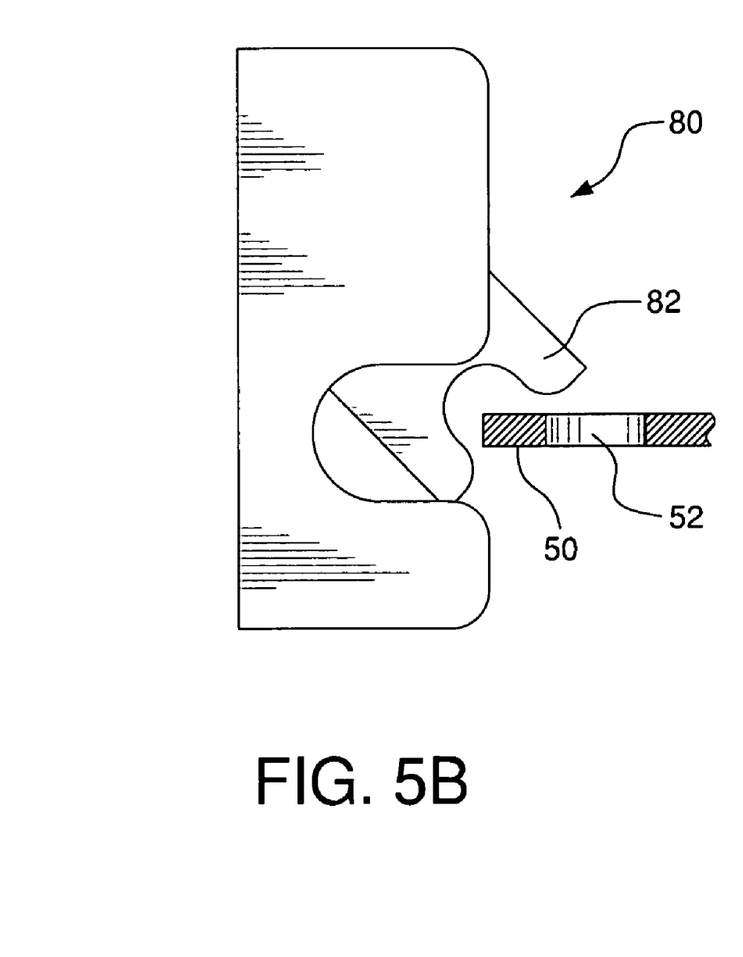

A rotary latch 80 similar to those used to secure doors of vehicles is presently preferred, since it is designed to latch reliably when the door is closed/slammed, and to remain engaged even under severe loadings. Suitable rotary latches can be obtained from a variety of sources. One such latch is available from Cleveland Hardware & Forging, Cleveland, Ohio. FIG. 4 illustrates one form of rotary latch 80 as is it used in a second embodiment of the invention. FIGS. 5A and 5B show the latch in its closed state (engaged with a striker) and its open state (with the striker not engaged), respectively.

In order to actuate the release lever, a linkage is preferably incorporated that extends to an outer surface of the enclosure. In the illustrated embodiment, the linkage extends toward the front face of the main section. The illustrated linkage includes a first linkage 86 that is pinned or otherwise pivotally mounted 88 to an upper end of the release lever 84. The first linkage 86 extends forward in a substantially horizontal direction. The first linkage 86 is preferably fixedly connected by bolts 88 to a second linkage 90. In the embodiment shown in the drawings, one of the two linkages is provided with several bolt holes 92, allowing the two linkages to be assembled in different relative positions, so that the distance from the release lever 84 to the front end of the second linkage 90 is adjustable. This enables the same latch 80 and linkages 86 and 90 to be used on enclosures of different depths D from the front to the rear of the main section 24. Alternatively, one of the linkages 86, 90 may be dimensioned so that it can be used alone.

The forward end 94 of the second linkage 90 projects through a slot 96 in the front flange 72. The forward end 94 may be shaped to make it easy to grip and pull forward in order to operate the release lever 84. As shown in FIG. 2, the forward end 94 of the second linkage 90 is provided with a handle, such as a finger hole 97. A hand grip (not shown) could be attached to the linkage instead of the finger hole to facilitate actuation of the lever. Movement of the second linkage 90, and thus of the latch 80, is controlled by a lock 98 that is mounted to the inside front of the main section. A keyhole of the lock 98 extend through a hole 100 formed in the front flange 72 of the wall 62. The lock 98 is preferably a key-operated rotary lock that rotates a blade 102 (see FIG. 3) between a locked position and an unlocked position. In the locked position, the blade 102 engages a notch 104 in the second linkage 90, preventing the second linkage being pulled forward. In the unlocked position, the blade 102 is swung away from the notch 104 (as shown in FIG. 3), allowing movement of the second linkage 90.

In the illustrated embodiment, the latch 80 is constructed such that it can engage when the main section is closed or slammed, even if the release lever 84 is held in the non-released position. If a latch 80 is used in which the release lever 84 moves when the latch engages (i.e., the striker rotates the locking member 82 until it engages the opening 52 as shown in FIGS. 5A and 5B), then the main section 24 can be closed and latched onto the back pan 22 even when the lock 98 is locked. Thus, the linkages 88, 90 may be returned to their non-release positions, and the lock 98 re-locked and the key removed as soon as the main section 24 has been opened away from the back pan 22. The main section 24 can subsequently be closed and latched simply by transitioning the main section into the closed position.

As may be seen in FIG. 1, the front flange 72 of the other side wall 60 may also include a slot 96 and a hole 100 (or knockouts), to enable the latch, linkages, and lock to be mounted on the other side when the hinges are reversed.

The present invention has particular use in rack systems that have two access modes. A front door maybe be hinged to the main section and include a separate mechanical lock that locks only the front door to the main section. Thus, access to the front of the main section is provided by unlocking the front door. Access to the back of the main section and the back pan is provided through the novel latch system described above.

As may be seen from FIG. 1, when the main section 24 is opened, a considerable clearance is required on the hinge side. To open the main section 24 through 90°, which is usually necessary in order to insert or remove full width rack-mounted modules through the back of the main section, a clearance almost equal to the depth D of the main section is needed. The depth D is typically about 20 inches (50 cm). However, on the latch side, almost no external clearance is needed since, in contrast to conventional locks for similar enclosures, the latch 80 is operated from the front of the enclosure at 94, 98 and not from the side. As such, a clearance of approximately 0.5 to 0.6 inches (12–15 mm) is typically needed on the latch side between adjacent enclosures or between an enclosure 20 and a side wall. This contrasts with conventional enclosures that require a minimum of 5 to 8 inches (12 to 20 cm) to allow a user to reach in alongside the enclosure to insert and turn a key in a lock.

Referring to FIG. 4, an alternate embodiment is shown. In this embodiment, the linkage is a single rod that extends from the release lever to the handle.

Although the invention has been described and illustrated with respect to the exemplary embodiments thereof, it should be understood by those skilled in the art that the foregoing and various other changes, omissions and additions may be made therein and thereto, without parting from the spirit and scope of the present invention. For example, instead of the latch 80 being manually actuated by the linkages 88, 90 and locked by the lock 98, the latch 80 may be actuated by a solenoid, controlled by a key switch such as that described in commonly owned U.S. patent application Ser. No. 11/023,066, filed on Dec. 27, 2004 in the name of Robert Schluter, which is incorporated herein by reference in its entirety.

Although the striker 50 has been shown in the drawings as a flat plate with a rectangular opening 52 closed on all sides, other shapes, such as round, elliptical, C-shaped, etc, are possible. For example, the opening 52 could be open along part or all of one side. This may make it possible to reduce the width of the striker 50, which may make it possible to reduce the width of the flanges 48 and 74, and of the whole enclosure 20.

Although the enclosure 20 has been described as wall-mounted, it may instead be partly or completely supported on a floor, either by the back pan 22 resting on the floor or by the main section 24 running on the floor on a wheel or caster, or both. A floor-mounted back pan 22 may be fastened to the floor instead of, or in addition to, being fastened to a wall or other structure behind the back pan.

Also, while the enclosure has been described as including a main section that is attached to a back pan through a vertical pivot hinge, it is also contemplated that the present invention can be used in an enclosure that includes a main section that is attached to a back pan or rear section through a horizontal pivot hinge. Thus, the main section would be designed to pivot upward or downward relative to the back pan. Thus, the orientational directional terms, such as front, back, top, bottom, and sides, are intended to describe the illustrated embodiment and, therefore, should only be considered exemplary.

Accordingly, reference should be made to the appended claims, rather than to the foregoing specification, as indicating the scope of the invention.

What is claimed is:

1. An enclosure for electrical equipment, comprising:
   a back section arranged to be mounted to a fixed support structure and having an open front;
   a main section adapted to contain electrical equipment, the main section having an open back and hinged to said back section;
   a latch mounted within one of the back section or main section, and arranged to latch the main section to the back section, the latch being actuatable between locked and unlocked positions; and
   a key-operated control mechanism mounted to the main section and engaged with the latch, the key-operated control mechanism including an axially-translatable linkage and a lock, the lock being actuatable by a key, the lock adapted to engage with the linkage in a locked state so as to prevent axial translation of the linkage, the linkage having a handle at one end which protrudes from the front of the main section and being connected at the other end to the latch, wherein axial displacement of the handle by a user produces actuation of the latch, the lock being accessible from the front of the main section.

2. An enclosure according to claim 1, wherein said main section has an open front, further comprising a door hinged to the main section and adapted to cover the open front of the main section, the door capable of being opened even when the lock is in the locked position so as to prevent axial translation of the linkage.

3. An enclosure according to claim 1, wherein the latch is a rotary latch mounted to the back of the main section and includes a release lever, wherein the linkage is connected to the release lever such that axial displacement of the handle away from the main section causes the linkage to rotate the release lever, the rotation of the release lever causing the latch to rotate out of engagement with a striker on the back section.

4. An enclosure according to claim 1, wherein the linkage includes a pair of linkage members adjustably connected together.

5. An enclosure for electrical equipment, comprising:
a back section arranged to be mounted to a fixed support structure and having an open front;
a main section adapted to contain electrical equipment, the main section having an open back and hinged to said back section;
a latch mounted within the main section, and arranged to latch the main section to the back section, the latch being actuatable between locked and unlocked positions; and
a key-operated control mechanism mounted to the main section and engaged with the latch, comprising a rotary cam lock and a linkage, the linkage including a handle protruding from the front of the main section being accessible from the front of the main section and a member connecting the handle with the latch, the rotary cam lock adapted to rotate into and out of engagement with a notch in the linkage, and arranged to permit a user to release the lock with a key, wherein displacement of the handle by a user produces actuation of the latch.

6. An enclosure according to claim 1, wherein the key operated control is in an unlocked position to close the main section.

7. An enclosure according to claim 1, wherein the latch is a rotary latch.

8. An enclosure according to claim 3, wherein the striker comprises a substantially flat mating plate with an opening into which the latch engages.

9. An enclosure for electrical equipment, comprising:
a back pan having a back, a top, a bottom, two sides, and an open front;
a main section arranged to contain rack-mounted electrical equipment, and having an open back, a top, a bottom, two sides, and a front, the main section hinged to the back pan about a hinge axis near one of the sides between and open and a closed position, the main section being accessible through the front when in its closed position;
a latch mounted inside the main section and arranged to engage the main section with the back pan when the main section is in its closed position, thereby preventing opening of the main section;
an axially-translatable linkage mounted to the side of the main section, operable from the front of the main section, the linkage being connected to the latch for releasing the latch when the linkage is translated in the axial direction and permitting opening of the main section; and
a lock operable from the front of the main section and arranged to enable axial translation of said linkage to release said latch only when said lock is unlocked.

10. An enclosure according to claim 9, wherein said latch is a rotary latch arranged to engage the back pan upon closing of the main section without requiring operation of the linkage or the lock.

11. An enclosure according to claim 9, further comprising a striker mounted on the back pan and protruding toward the main section, the striker adapted to be engaged by the latch when the main section is closed.

12. An enclosure according to claim 10, further comprising a striker mounted on the back pan and adapted to be engaged by the latch when the main section is closed, the striker arranged to cause the rotary latch to engage the striker upon closing of the main section.

13. An enclosure according to claim 10, wherein the striker comprises a substantially flat mating plate with an opening to which the rotary latch engages.

14. An enclosure according to claim 9, wherein the front of the main section is at least partly open, further comprising a door covering at least part of the open front of the main section, the door being capable of being opened independent of the locked state of the lock.

15. An enclosure for electrical equipment, comprising:
a back pan having a back, a top, a bottom, two sides, and an open front a striker mounted on the back pan and protruding toward the main section, the back pan having a striker extending out of the open front;
a main section arranged to contain rack-mounted electrical equipment, and having an open back, a top, a bottom, two sides, and a front, the main section hinged to the back pan about a hinge axis near one of the sides between and open and a closed position, open back of the main section being positioned against the open front of the back pan when the main section is in its closed position, the main section being accessible through the front when in its closed position;
a rotary latch mounted inside the main section adjacent to the open back, the rotary latch arranged to engage with the striker when the main section is in its closed position, thereby preventing opening of the main section, the rotary latch adapted to automatically engage with the striker when the main section is moved into the closed position;
an axially-translatable linkage mounted to the side of the main section and operable from the front of the main section, the linkage being connected to the latch for releasing the latch when the linkage is translated in the axial direction and permitting opening of the main section; and
a rotary lock operable from the front of the main section and arranged to prevent axial translation of the linkage and enable operation of said linkage to release said latch only when said lock is unlocked.

16. An enclosure according to claim 15, wherein the front of the main section is at least partly open, further comprising a door covering at least part of the open front of the main section, the door being capable of operation independently of the latch, linkage, and lock.

17. An enclosure according to claim 15, wherein the rotary latch includes a release lever, wherein the axially-translatable linkage is connected to the release lever and extends to the front of the main section and includes a handle protruding out of the main section, wherein axial displacement of the handle away from the main section causes the linkage to rotate the release lever, the rotation of the release lever causing the latch to rotate out of engagement with a striker.

* * * * *